(12) United States Patent
Chang

(10) Patent No.: US 10,784,250 B2
(45) Date of Patent: Sep. 22, 2020

(54) SUB-DEVICE FIELD-EFFECT TRANSISTOR ARCHITECTURE FOR INTEGRATED CIRCUITS

(71) Applicant: Marvell World Trade Ltd., St. Michael (BB)

(72) Inventor: Runzi Chang, Saratoga, CA (US)

(73) Assignee: MARVELL ASIA PTE, LTD., Singapore (SG)

(*) Notice: Subject to any disclaimer, the term of this patent is extended or adjusted under 35 U.S.C. 154(b) by 0 days.

(21) Appl. No.: 16/372,905

(22) Filed: Apr. 2, 2019

(65) Prior Publication Data

US 2020/0066706 A1 Feb. 27, 2020

Related U.S. Application Data

(60) Provisional application No. 62/720,814, filed on Aug. 21, 2018.

(51) Int. Cl.

| H01L 27/088 | (2006.01) |
|---|---|
| H01L 21/8234 | (2006.01) |
| H01L 27/02 | (2006.01) |
| H03K 17/687 | (2006.01) |

(52) U.S. Cl.
CPC ...... *H01L 27/0207* (2013.01); *H01L 21/8234* (2013.01); *H01L 21/823431* (2013.01); *H01L 27/0886* (2013.01); *H03K 17/6871* (2013.01)

(58) Field of Classification Search
CPC ......... H01L 21/8234; H01L 21/823431; H01L 27/0207; H01L 27/0886; H03K 17/6871

USPC ................. 327/564, 565, 566, 581
See application file for complete search history.

(56) References Cited

U.S. PATENT DOCUMENTS

| 4,584,662 A * | 4/1986 | Lin .......................... G06G 7/62 |
| | | 327/434 |
| 7,652,520 B2 * | 1/2010 | Gatta ................... H01L 27/0705 |
| | | 327/436 |
| 9,379,112 B2 * | 6/2016 | Chang .................. H01L 27/0617 |
| 2014/0008732 A1 * | 1/2014 | Hyvonen ............... H01L 27/088 |
| | | 257/390 |
| 2015/0221723 A1 * | 8/2015 | Allibert ............... H01L 27/0207 |
| | | 257/347 |

* cited by examiner

*Primary Examiner* — William Hernandez

(57) ABSTRACT

The present disclosure describes aspects of a sub-device field-effect transistor architecture for integrated circuits. In some aspects, an integrated field-effect transistor (FET) is implemented with multiple FET sub-devices. During operation, source-side FET sub-devices of the integrated FET may operate in the linear region instead of in saturation. Operating in the linear region, the source-side FET sub-devices of the integrated FET may exhibit less threshold voltage or current sensitivity than other drain-side FET sub-devices that operate in saturation. A device layout of the integrated FET may be designed such that the less sensitive source-side FET sub-devices surround or protect the other more sensitive drain-side FET sub-devices from random variations or density issues at edges of the device layout. By so doing, a threshold voltage or current sensitivity of the integrated FET may be reduced, resulting in improved matching between integrated FET devices.

20 Claims, 9 Drawing Sheets

SUB-DEVICE FIELD-EFFECT TRANSISTOR ARCHITECTURE FOR INTEGRATED CIRCUITS

CROSS REFERENCE TO RELATED APPLICATIONS

This present disclosure claims priority to U.S. Provisional Patent Application Ser. No. 62/720,814 filed Aug. 21, 2018, the disclosure of which is incorporated by reference herein in its entirety.

BACKGROUND

In analog circuit design, semiconductor devices are often matched such that separate semiconductor devices perform similarly to ensure correct operation of an analog circuit. The semiconductor devices of the analog circuit are often matched to minimize differences (e.g., threshold voltage) between the devices by designing each semiconductor device with substantially similar dimensions and configurations. As semiconductor technologies scale to smaller devices, however, it can be increasingly difficult to meet semiconductor device matching requirements due to process limitations, such as those associated with photolithography, etch, and chemical mechanical planarization processes. When semiconductor devices exhibit characteristics of mismatch due to random process or manufacturing variability that designers fail to address, performance of semiconductor devices can deteriorate, or the function of the circuit may be impaired.

SUMMARY

This summary is provided to introduce subject matter that is further described in the Detailed Description and Drawings. Accordingly, this Summary should not be considered to describe essential features nor used to limit the scope of the claimed subject matter.

This disclosure is directed to a sub-device field-effect transistor architecture for integrated circuits, which may include analog circuits or mixed-signal circuits. In some aspects, a circuit is implemented with an integrated field-effect transistor (FET) formed by or with multiple FET sub-devices. The multiple FET sub-devices may be stacked (e.g., drain-to-source) and have respective gates that are coupled together. During operation, some source-side FET sub-devices of the integrated FET can operate in the linear region instead of saturation. Operating in the linear region, the source-side FET sub-devices of the integrated FET may exhibit less threshold voltage or current sensitivity than other FET sub-devices that operate in saturation. A device layout of the integrated FET can be designed or optimized such that the less sensitive source-side FET sub-devices surround, shield, or protect the other more sensitive FET sub-devices (e.g., drain-side) of the integrated FET from random variations or density issues at edges of the device layout. By so doing, a threshold voltage or current sensitivity of the integrated FET can be reduced, resulting in improved matching between integrated FET devices.

In some aspects, a method forms an integrated FET with FET sub-devices and includes forming a substrate for the FET sub-devices of the integrated FET. The method then forms, on the substrate, a first set of the FET sub-devices of the integrated FET. A first FET sub-device of the first set of FET sub-devices is coupled to a drain terminal of the integrated FET. A second set of the FET sub-devices of the integrated FET is also formed on the substrate, with a second FET sub-device of the second set of the FET sub-devices being coupled to a source terminal of the integrated FET. The first set of the FET sub-devices is formed on an interior portion of substrate area on which the integrated FET is formed. Additionally, the second set of the FET sub-devices can be formed proximate a perimeter of the substrate area on which the integrated FET is formed.

In other aspects, an integrated circuit comprises a substrate having a surface and an integrated field-effect transistor (FET) that includes an array of FET sub-devices formed on the surface of the substrate. The array of the FET sub-devices includes a first group of FET sub-devices having respective gates coupled to a gate terminal of the integrated FET and one FET sub-device having a drain coupled to a drain terminal of the integrated FET. The array of the FET sub-devices also includes a second group of FET sub-devices having respective gates coupled to the gate terminal of the integrated FET and one FET sub-device having a source coupled to a source terminal of the integrated FET. The array of FET sub-devices is formed on the surface of the substrate such that the second group of FET sub-devices are disposed around at least three sides of substrate area on which the first group of FET sub-devices are disposed.

In yet other aspects, a method provides, via a power rail, current to a source terminal of an integrated FET formed by multiple FET sub-devices. The method then applies voltage to a gate terminal of the integrated FET to operate a first group of the multiple FET sub-devices in linear mode and a second group of the FET sub-devices in saturation mode. Based on the voltage applied to the gate terminal, at least a portion of the current is provided to a drain terminal of the integrated FET via the first group and the second group of the multiple FET sub-devices of the integrated FET.

The details of one or more implementations are set forth in the accompanying drawings and the following description. Other features and advantages will be apparent from the description and drawings, and from the claims.

BRIEF DESCRIPTION OF THE DRAWINGS

The details of one or more implementations of a sub-device field-effect transistor (FET) architecture for integrated circuits are set forth in the accompanying figures and the detailed description below. In the figures, the left-most digit of a reference number identifies the figure in which the reference number first appears. The use of the same reference numbers in different instances in the description and the figures indicates like elements.

DETAILED DESCRIPTION

Figure 1:
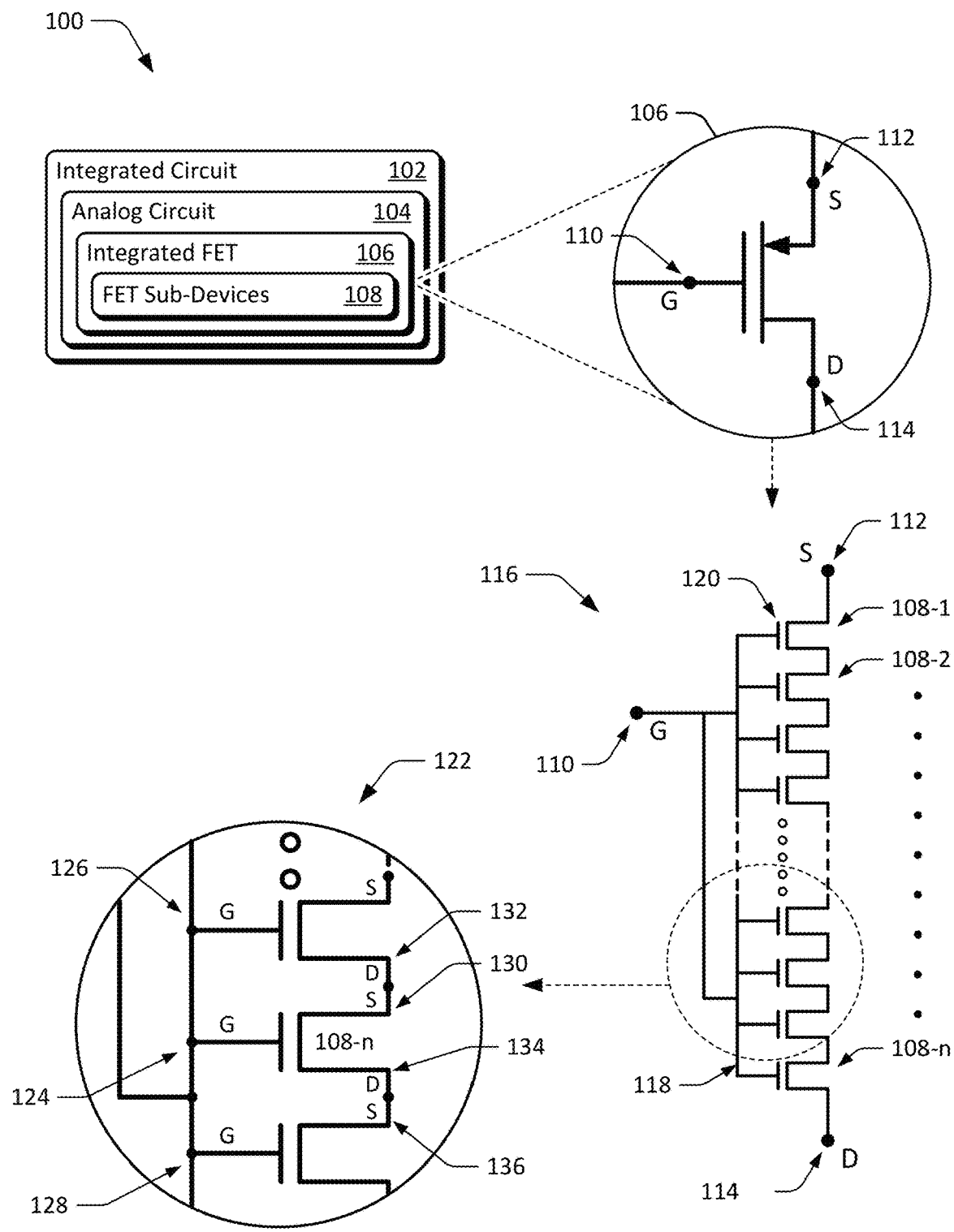
FIG. 1 illustrates an example operating environment having integrated circuits in which FET sub-devices are implemented.

Conventional techniques for managing device mismatch typically rely on scaling layout of a single device to the largest viable size in order to minimize variations between respective dimensions of two devices. Generally, differences in semiconductor area or geometry between devices caused by process variations can further increase mismatch between the devices. In particular, for a given process technology with certain mismatch capability, designers typically choose to maximize transistor width and length to achieve better matched devices on the curve of $A_{VT}$, which is the slope of the sigma of delta $V_T$ (threshold voltage) vs. the reciprocal of sqrt(WL) plot based on the classic Pelgrom Model. With the increase in size of each device, the belief was that gate length variation percentage would be better when device length was maximized.

As semiconductor technologies scaled to smaller devices, however, the deficiencies of conventional techniques became readily apparent. As noted, it is increasingly difficult to meet device matching requirements for advanced analog designs due to process limitations associated with photolithography, etch, and chemical mechanical planarization processes. This issue is of particular relevance with advanced fin field-effect transistors (FinFETs) where scaling of the process technology can substantially reduce the effectiveness of conventional maximum geometry-based techniques. For example, with nanometer devices (e.g., FinFETs) in which the silicon body of the device is practically un-doped, $A_{VT}$ is increasingly affected by fluctuations of metal gate work function settings, thickness, compositions, and the like. These are strong functions of device pattern densities for circuit layout, as opposed to the polygate line edge roughness (LER), the effects of which tend to average out for longer transistors.

The conventional techniques are also unable to efficiently address issues associated with device pattern densities, as those techniques rely on dummy patterns that consume valuable layout area. In this approach, non-functional or dummy pattern devices are placed around the real circuits so that the pattern densities may be controlled across the key blocks. While this approach may have addressed density issues with circuits located in different areas of a chip, the use of dummy devices is no longer effective or efficient for devices fabricated with current process technologies. A primary problem with dummy devices is low utilization efficiency of layout area and inferior mismatch due to the failure of dummy layout techniques to evolve concurrently with newer process technologies. Another issue is that post-CMP metal gate work function metal thickness is a function of layout uniformity, which may result in larger pattern density variations when analog designers use arbitrarily large device dimensions (width/length). Thus, conventional methods of increasing device size often create larger pattern density variations that result in worse $V_T$ (threshold voltage) mismatch. As a result, these conventional techniques for managing device mismatch are no longer efficient, particularly with advanced process technologies that implement metal gate devices.

In contrast with the conventional techniques, this disclosure describes aspects of a sub-device field-effect transistor (FET) architecture for integrated circuits. In some aspects, a circuit is implemented with an integrated FET formed by or with multiple FET sub-devices. The multiple FET sub-devices may be stacked (e.g., drain-to-source) and may have respective gates that are coupled together. During operation, some source-side FET sub-devices of the integrated FET may operate in the linear region instead of saturation. Operating in the linear region, the source-side FET sub-devices of the integrated FET may exhibit less threshold voltage or current sensitivity than other FET sub-devices that operate in saturation. A device layout of the integrated FET can be designed or optimized such that the less sensitive source-side FET sub-devices surround, shield, or protect the other more sensitive FET sub-devices (e.g., drain-side) of the integrated FET from random variations or density issues at edges of the device layout. By so doing, a threshold voltage or current sensitivity of the integrated FET can be reduced, resulting in improved matching between integrated FET devices.

By way of review, recall that a metal-oxide-semiconductor field-effect transistor (MOSFET) has three primary modes of operation that include cutoff, linear, and saturation. By examining drain current and in turn current sensitivity for each mode, it will be apparent that aspects of sub-device FET architecture for integrated circuits can reduce threshold voltage sensitivity and improve matching for analog circuits. In particular, current sensitivity to threshold voltage ($\partial I_d / \partial V_t$) of a given transistor is larger in saturation mode than in linear mode.

With reference to the following equations that illustrate the MOSFET modes of operation, the variables are defined with reference to voltage and current at terminals of the MOSFET, where W/L is a ratio of transistor geometry (width/length) and $k'_n$ is the process conduction parameter.

MOSFET drain current in cutoff region.     Equation 1

$$V_{GS} - V_T < 0, I_D = 0$$

MOSFET drain current in linear region (resistive).     Equation 2

$$V_{GS} - V_T < V_{DS}$$

$$I_D = k'_n \cdot \frac{W}{L} \cdot \left[ (V_{GS} - V_T) \cdot V_{DS} - \frac{V_{DS}^2}{2} \right]$$

-continued

MOSFET drain current in saturation region. Equation 3

$$0 < V_{GS} - V_T < V_{DS}$$

$$I_D = \frac{1}{2}k'_n \cdot \frac{W}{L} \cdot (V_{GS} - V_T)^2 \cdot (1 + \lambda \cdot V_{DS})$$

Based on equations 1-3, we see that current sensitivity for different modes of operation are as follows:

Current Sensitivity to $V_t$ in the linear region. Equation 4

$$\frac{\partial I_d}{\partial V_t} = -V_{ds} \cdot k'_n \cdot \frac{W}{L}$$

$$\frac{I_d}{\frac{\partial I_d}{\partial V_t}} = \frac{V_{ds}}{2} - (V_{gs} - V_t)$$

Current sensitivity to $V_t$ in the saturation region. Equation 5

$$\frac{\partial I_d}{\partial V_t} = -(V_{gs} - V_t) \cdot k'_n \cdot \frac{W}{L} \cdot (1 + \lambda \cdot V_{ds})$$

$$\frac{I_d}{\frac{\partial I_d}{\partial V_t}} = -\frac{(V_{gs} - V_t)}{2}$$

Current sensitivity ratio of the saturation region to the linear region. Equation 6

$$\frac{\frac{V_{ds}}{2} - (v_{gs} - V_t)}{-(V_{gs} - V_t)/2} = \frac{2(V_{gs} - V_t) - V_{ds}}{(V_{gs} - V_t)} = 2 - \frac{V_{ds}}{(V_{gs} - V_t)} > 1$$

As shown in equation 6, the ratio of current sensitivity of the saturation region to the linear region is greater than 1 because $V_{gs}$-$V_t$ is larger than $V_{ds}$ in the linear region. Therefore, the devices operating in the saturation region are more prone or sensitive to $V_t$ variations, such as those associated with layout environment uncertainties. Conversely, devices operating in the linear region are less sensitive to $V_t$ variations, making these devices less susceptible to the environment uncertainties or layout density issues.

This result can be leveraged by laying out the FET sub-devices of an integrated FET to protect the more sensitive drain-side FET sub-devices with the source-side FET sub-devices that can operate in linear mode. For example, when designing a current mirror circuit, drain-side FET sub-devices can be placed in the center of a current mirror layout array, with other source-side FET sub-devices placed at or around the edge of the array. By so doing, the more sensitive drain-side FET sub-devices, which are likely to operate in saturation region, may be protected by the layout-identical source-side FET sub-devices at the edge of the array.

These source-side FET sub-devices are likely to operate in linear region and are thus less prone to random environmental variations around the array. Although the edge devices may be exposed to a more-random outer environment in final layout, these devices may preclude the need for dummy devices, saving valuable design area and cost. Effectively, due to the low current-to-threshold voltage sensitivity of the source-side FET sub-devices, impact of environmental variance can be minimized through the use of the edge devices to "self-dummify" the current mirror array. Examples of this layout and other aspects of the sub-device FET architecture are described throughout the disclosure. In at least some aspects, analog circuit layouts with FET sub-devices can be created and for optimized device mismatch for a given area budget of cost and/or power. The concepts described herein are also highly scalable with advanced semiconductor process technologies with minimal, if any, impact on circuit design and layout resources.

The following discussion describes an operating environment, techniques that may be employed in the operating environment, and a System-on-Chip (SoC) in which components of the operating environment can be embodied. In the context of the present disclosure, reference is made to the operating environment by way of example only.

Operating Environment

FIG. 1 illustrates an example operating environment 100 having an integrated circuit 102 implemented in accordance with aspects of a sub-device field-effect transistor (FET) architecture for integrated circuits. The integrated circuit 102 may include any suitable type of circuitry such as digital circuitry, analog circuitry, or mixed-signal circuitry. In this example, the integrated circuit 102 includes an analog circuit 104 and may include other digital or mixed-signal circuits (not shown). In some cases, the integrated circuit 102 may be implemented in an analog block of multiple analog circuits 104. Alternately or additionally, the integrated circuit 102 may be implemented as part of a chip or die, such as a system-on-chip (SoC), application-specific integrated-circuit (ASIC), application-specific standard product (ASSP), digital signal processor (DSP), multi-chip module (MCM), programmable SoC (PSoC), system-in-package (SiP), or field-programmable gate array (FPGA).

As shown in FIG. 1, the analog circuit 104 includes an integrated FET 106 formed by or with multiple FET sub devices 108. The integrated FET 106 may be implemented as any suitable type of MOSFET device, such as an N-channel MOSFET or a P-channel MOSFET. In this example, the integrated FET 106 is illustrated as a P-channel MOSFET having a gate terminal 110, a source terminal 112, and a drain terminal 114 that enable respective connections to other circuitry. As shown at 116, the integrated FET 106 is composed of or formed from multiple FET sub-devices 108, which are illustrated as 108-1 through 108-n, where n is any suitable integer.

The FET sub-devices 108 may be stacked as shown at 120 (e.g., in a channel length direction) with gates 118 that are coupled or connected to the gate terminal 110 of the integrated FET 106. In some cases, a number and geometry of the stacked FET sub-devices 108 are selected such that the FET sub-device stack provides an electrically equivalent function (W/L) of a larger, single semiconductor device. In other words, a circuit designer may divide a single FET device into a stack of FET sub-devices 108 to achieve similar electrical performance with less threshold voltage sensitivity and improved matching characteristics. The implementations and uses of the FET sub-devices 108 vary and are described throughout the disclosure.

As shown in greater detail at 122, respective gates of each of FET sub-device 108 of the stack may be connected together. Here, a gate 124 of the FET sub-device 108-*n* is coupled or connected to gates 126 and 128 of other FET sub-devices in the stack. The FET sub-device 108-*n* may also be coupled to other adjacent FET sub-devices 108 via a source-to-drain or drain-to-source coupling. By way of example, a source 130 of the FET sub-device 108-*n* is coupled to a drain 132 of a FET sub-device higher in the stack. A drain 134 of the FET sub-device 108-*n* is coupled to a source 136 of another FET sub-device lower in the stack. Such connections may be similarly made throughout the stack of FET sub-devices to form the integrated FET 106.

In contrast with a single device of an analog circuit (e.g., current mirror) that operates entirely in saturation, the FET sub-device stack of the integrated FET 106 may operate in a heterogeneous mode in which some FET sub-devices 108 operate in saturation mode and others of the FET sub-devices 108 operate in linear mode. For example and with reference to the terminals of the integrated FET 106, the FET sub-devices 108 coupled to or proximate to the drain terminal 114 may operate in saturation mode ($0<V_{GS}-V_T<V_{DS}$) while other FET sub-devices 108 coupled to or proximate to the source terminal 112 may operate in linear mode ($V_{GS}-V_T<V_{DS}$). Accordingly, reference may be made to drain-side FET sub-devices that are configured to or will likely operate in saturation mode or to source-side FET sub-devices that are configured to or will likely operate in linear mode.

In some aspects, respective operation modes of the FET sub-devices 108 are governed or are caused by a configuration of a circuit in which the integrated FET 106 is embodied. Alternately or additionally, a circuit designer may configure the stack to include a particular (e.g., maximum) number of FET sub-devices 108 by using a sub-device gate length for the sub-devices that is approximately a minimum gate length ($L_g$) allowed by a given process technology. Generally, a stack may be implemented with any suitable ratio of the source-side FET sub-devices to drain-side FET sub-devices, which may vary over ranges of 55%-45% to 45%-55%. Alternately or additionally, integrated FETs 106 may be implemented with wider ratios of source-side FET sub-devices to drain-side FET sub-devices, such as over ranges of approximately 65%-35% to 35%-65% in sub-device mode allocation.

Figure 2:
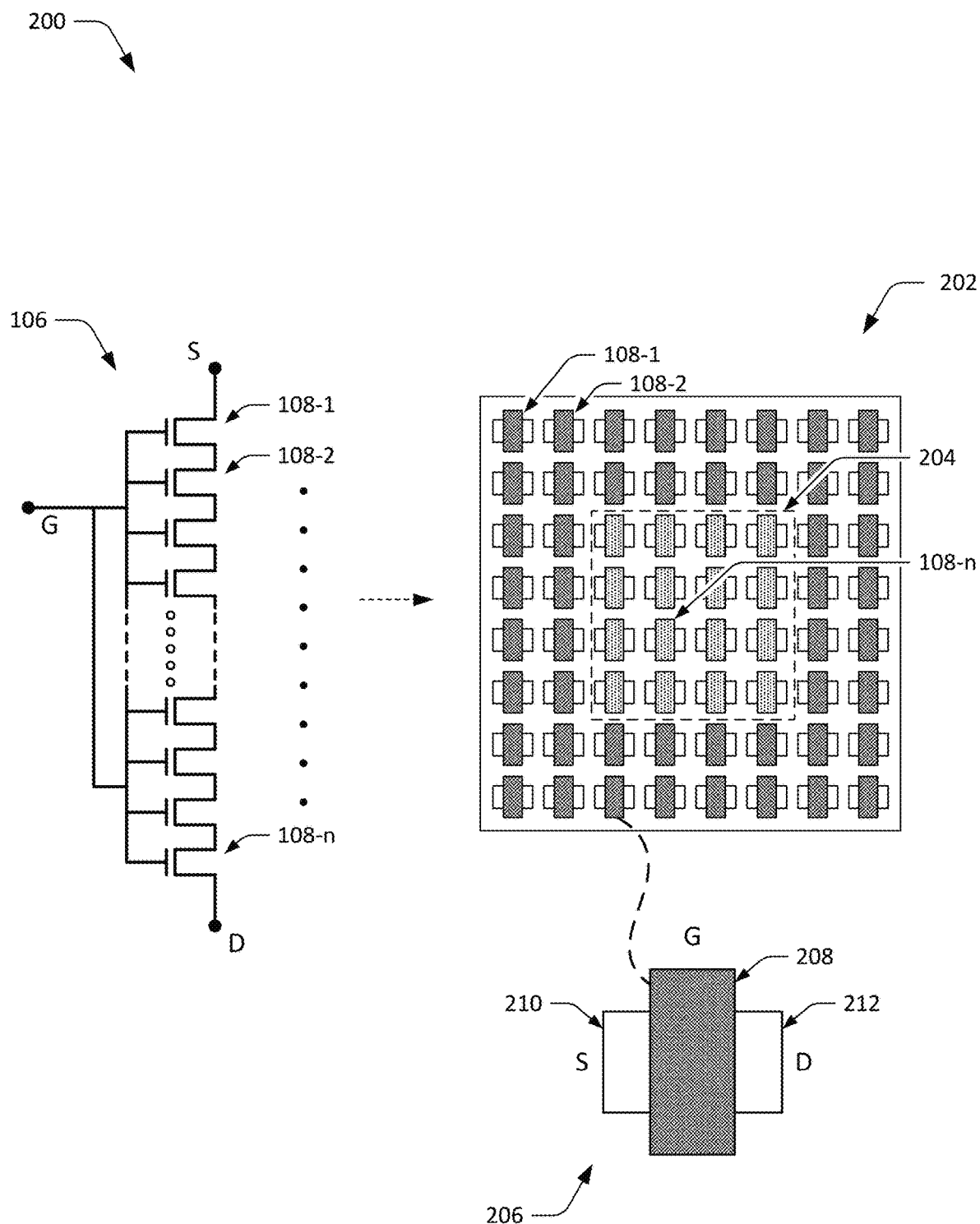
FIG. 2 illustrates an example layout of FET sub-devices of an integrated FET in accordance with one or more aspects.

FIG. 2 illustrates an example layout at 200 of FET sub-devices of an integrated FET in accordance with one or more aspects. The layout 200 may include an array 202 of FET sub-devices 108-1 through 108-*n* as described with reference to FIG. 1. Here, differences in threshold voltage sensitivity between source-side FET sub-devices and drain-side FET sub-devices may be leveraged to optimize layout of the FET sub-devices for device matching. In this example, the less sensitive devices starting with source-side FET sub-devices 108-1 and 108-2 are placed near an edge or perimeter of the layout 200.

These source-side FET sub-devices and other less sensitive FET sub-devices may be used to buffer or "self-dummify" an area 204 that is designated for FET sub-devices that are more sensitive to environmental variances or layout pattern variations. The more sensitive devices of the array 202, such as the drain-side FET sub-device 108-*n* may be placed in area 204 to reduce an impact of environmental variance around the edge of the layout 200. Note that the term "self-dummify" is used to describe the source-side FET sub-devices which are functional devices of the array, in contrast with conventional dummy devices that consume design area without providing circuit functionality.

With respect to the layout of an individual FET sub-device 108, a sub-device may be implemented using FinFET or three-dimensional (3D) fabrication processes. As shown at 208, a sub-device may be fabricated with a FinFET gate structure 208 formed over source region 210 and drain region 212 to implement the sub-device. This is but one example, as any other suitable process technology may be implemented in association with the sub-device FET architecture described herein. For example, the described concepts, such as sub-devices and self-dummification, are also applicable to sub-20 nm process technologies implemented through advanced 3D transistor architectures and EUV (Extreme Ultra Violet) lithography technologies.

Figure 3:
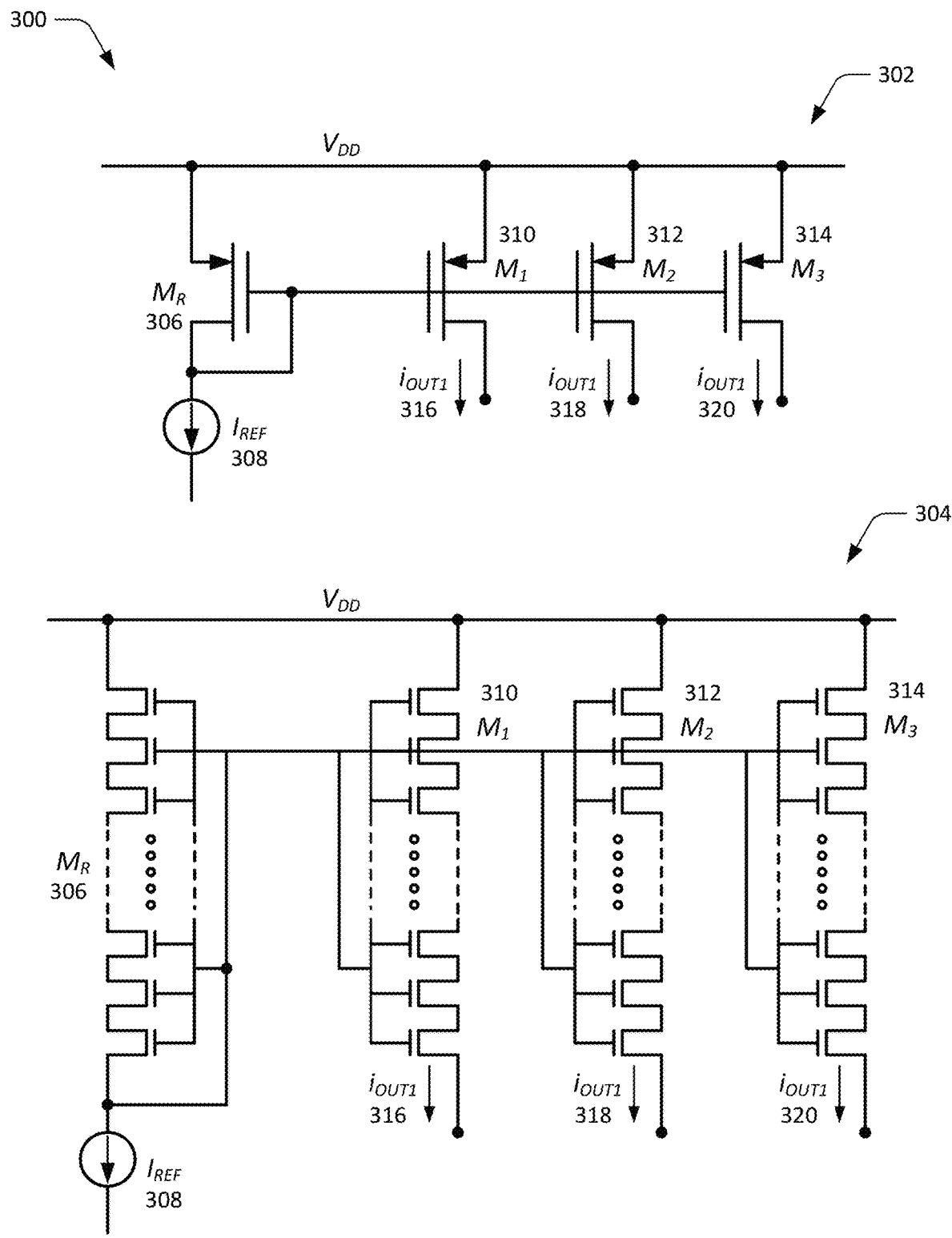
FIG. 3 illustrates an example configuration of a current mirror implemented with a FET sub-device architecture.

FIG. 3 illustrates an example configuration of a current mirror at 300 implemented with the sub-device FET architecture described herein. In this example, the current mirror is shown in schematic form as implemented with integrated FET devices at 302 and with the integrated FET devices shown as respective FET sub-device stacks at 304. In contrast with conventional layouts where transistor size (e.g., gate length) is maximized in an attempt to address mismatch, aspects of the sub-device architecture may be implemented with stacks of smaller FET sub-devices that operate in a heterogeneous mode with some FET sub-devices operating in linear mode and others operating in saturation mode. As described herein, the FET sub-devices operating in linear mode may be less sensitive to environmental variances, which can enable optimized layouts for analog circuit designs.

In this example, the current mirror 302 is implemented with a reference integrated FET device 306 (reference device 306) which sets a reference current 308 for the current mirror 302. The gate of the reference device 306 is coupled or connected to respective gates of mirror integrated FET devices 310, 312, and 314 (mirror devices 310, 312, and 314). Based on matching between the reference device 306 and the mirror devices 310, 312, and 314, the mirror devices 310, 312, and 314 provide respective output currents 316, 318, and 320 that mirror the reference current 308.

Figure 4:
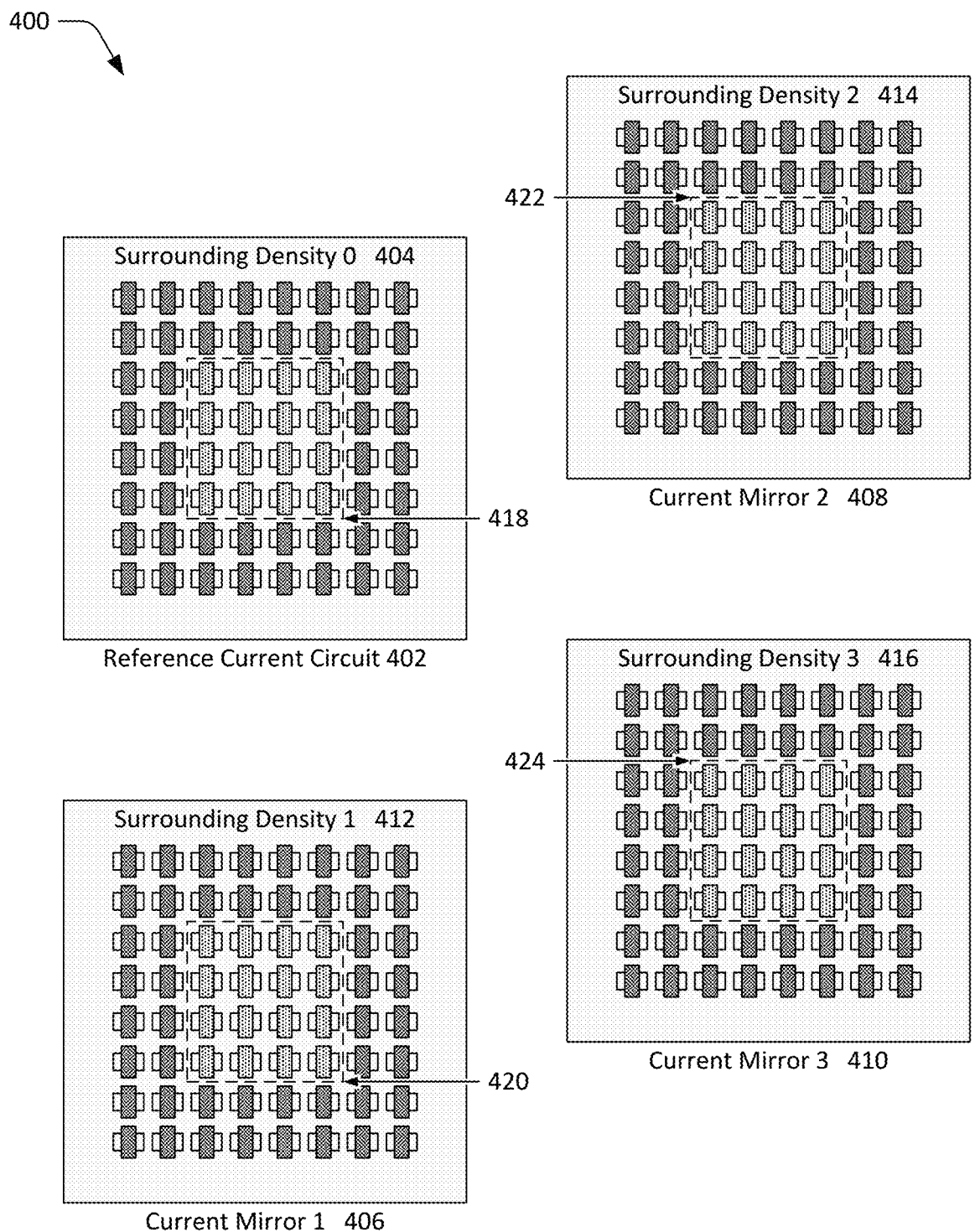
FIG. 4 illustrates an example layout of multiple arrays of FET sub-devices for the current mirror of FIG. 3 in accordance with one or more aspects.

When implementing the reference device 306 and mirror devices 310, 312, and 314 as FET sub-devices, matching of the respective devices may be improved through advantageous circuit layout. By way of example, consider FIG. 4 which depicts a layout of multiple arrays of FET sub-devices at 400 for the current mirror 304. Here, the current mirror layout arrays may be optimized by positioning the drain-side sub-devices in the center while the source-side devices are positioned at the edges, utilizing the concept of "self-dummification" as discussed herein. This technique may preclude the need to add extra dummy devices to address mismatch, thereby saving design area and cost.

In this example, a reference current circuit 402 includes sub-devices of the reference device and has a surrounding density 0 404 that may be unique to the reference current circuit 402 or may differ from other areas of the layout. The array layout also includes respective sub-devices arrays for current mirror 1 406 (e.g., mirror device 310), current mirror 2 408 (e.g., mirror device 312), and current mirror 3 410 (e.g., mirror device 314). Here, note that each array of sub-devices may be configured with a same or similar number and geometry of sub-devices, while the surrounding densities 412, 414, and 416 may vary from surrounding density 0 404 or each other. In accordance with aspects of sub-device FET architecture, the more sensitive sub-devices (e.g., drain-side sub-devices) may be placed in respective areas 418, 420, 422, and 424 of the arrays to reduce environmental variations associated with the different surrounding densities. By so doing, matching between the reference array and mirror arrays can be improved with minimal or no cost in design area (e.g., no dummy devices).

Note, the concepts described herein may also apply to other mixed-signal circuits or analog circuits, such custom layout circuits. By way of example, when device mismatch affects circuit performance, aspects of the sub-device FET architecture and associated layout may be used to improve device performance or match between separate devices and/or devices located in different areas of a circuit layout.

Techniques of Sub-Device FET Architecture for ICs

The following discussion describes techniques of sub-device FET architecture for integrated circuits. These techniques may be implemented using or embodying any of the entities described herein, such as those described with reference to FIG. 1-4, 8, or 9. These techniques include methods illustrated in FIGS. 5, 6, and 7, each of which is shown as a set of operations performed by one or more entities.

These methods are not necessarily limited to the orders of operations shown. Rather, any of the operations may be repeated, skipped, substituted, or re-ordered to implement various aspects described herein. Further, these methods may be used in conjunction with one another, in whole or in part, whether performed by the same entity, separate entities, or any combination thereof. In portions of the following discussion, reference will be made to the operating environment 100 of FIG. 1 and entities of FIG. 2, FIG. 3, and/or FIG. 4 by way of example. Such reference is not to be taken as limiting described aspects to the operating environment 100, entities, or configurations, but rather as illustrative of one of a variety of examples. Alternately or additionally, operations of the methods may also be implemented by or with entities described with reference to the System-on-Chip of FIG. 8 or devices of FIG. 9.

Figure 5:
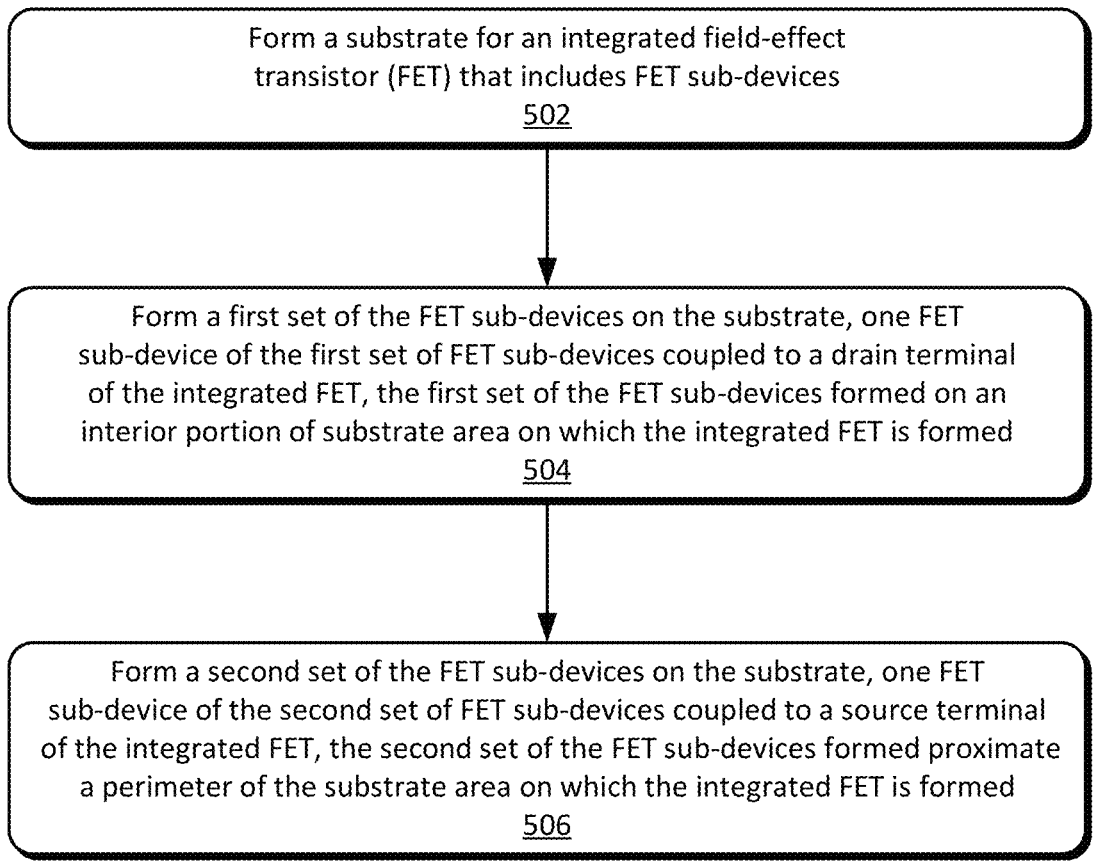
FIG. 5 depicts an example method for forming FET sub-devices of an integrated FET on a substrate.

FIG. 5 depicts an example method 500 for forming FET sub-devices of an integrated FET on a substrate. In some aspects, the method 500 is implemented to provide an integrated FET for analog or mixed-signal circuits. Alternately or additionally, the operations described with reference to method 500 or other methods may be implemented through one or more semiconductor fabrication processes, such as photolithography, masking, etching, chemical vapor deposition, and/or chemical mechanical planarization.

At 502, a substrate is formed for an integrated FET that includes FET sub-devices. The integrated FET may be configured as part of an analog circuit or mixed-signal circuits, such as a current mirror, an amplifier, a filter, an analog-to-digital converter, or a digital-to-analog converter. Alternately or additionally, the substrate may be formed to support multiple integrated FETs that are matched or configured with ratios in accordance with an analog circuit design.

At 504, a first set of the FET sub-devices are formed on the substrate. The first set of FET sub-devices may be stacked in series source-to-drain or have coupled gates. One FET sub-device of the first set formed is coupled to a drain terminal of the integrated FET. As such, the first set of FET sub-devices may be implemented as drain-side devices of the integrated FET. Thus, the first set of the FET sub-devices may be formed on an interior portion of substrate area on which the integrated FET is formed.

At 506, a second set of the FET sub-devices are formed on the substrate. The second set of FET sub-devices may be stacked in series source-to-drain or have coupled gates. One sub-device of the second set of FET sub-devices is coupled to a source terminal of the integrated FET. As such, the second set of FET sub-devices may be implemented as source-side devices of the integrated FET. Thus, the second set of the FET sub-devices are formed proximate to a perimeter or edge of the substrate area on which the integrated FET is formed.

Figure 6:
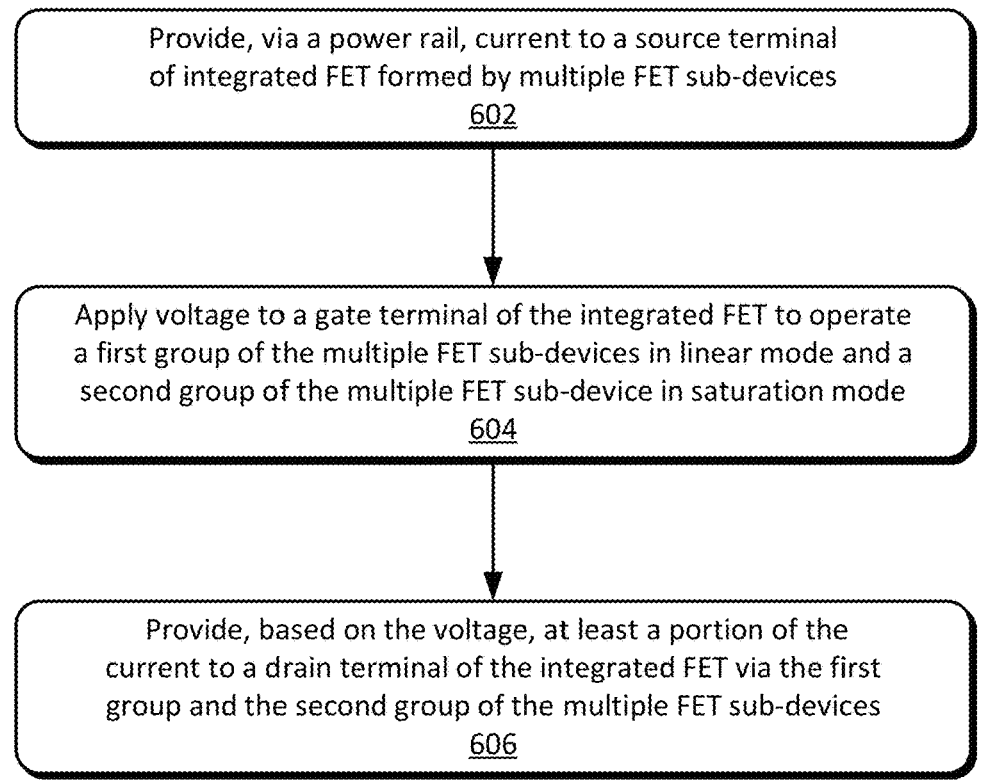
FIG. 6 depicts an example method for operating an integrated FET to provide current via multiple FET sub-devices.

FIG. 6 depicts an example method 600 for operating an integrated FET to provide current via multiple FET sub-devices of the integrated FET.

At 602, current is provided, via a power rail, to a source terminal of an integrated FET formed by multiple FET sub-devices. Generally, the multiple FET sub-devices may include a first group of FET sub-devices coupled to a drain terminal of the integrated FET and a second group of FET sub-devices coupled to the source terminal of the integrated FET. In some cases, a source of a FET sub-device of the second group is coupled to the source terminal of the integrated FET. As such, the second group of FET sub-devices may be implemented as source-side devices that are less sensitive to environmental variation. In a layout of the integrated FET, the second group of FET sub-devices may be arranged as edge devices or as self-dummy devices for more sensitive FET sub-devices of the integrated FET.

At 604, voltage is applied to a gate terminal of the integrated FET to operate a first group of the multiple FET sub-devices in linear mode and a second group of the FET sub-devices in saturation mode. In some cases, respective gates of the first and second groups of the multiple FET sub-devices are coupled to the gate terminal of the integrated FET.

At 606, at least a portion of the current is provided, based on the voltage applied to the gate terminal, to a drain terminal of the integrated FET via the first group and the second group of the multiple FET sub-devices of the integrated FET. In some cases, a drain of a FET sub-device of the first group is coupled to the drain terminal of the integrated FET. As such, the first group of FET sub-devices may be implemented as drain-side devices that are more sensitive to environmental variation. In the layout of the integrated FET, the first group of FET sub-devices may be arranged at the center of the layout to minimize effects of layout variation.

Figure 7:
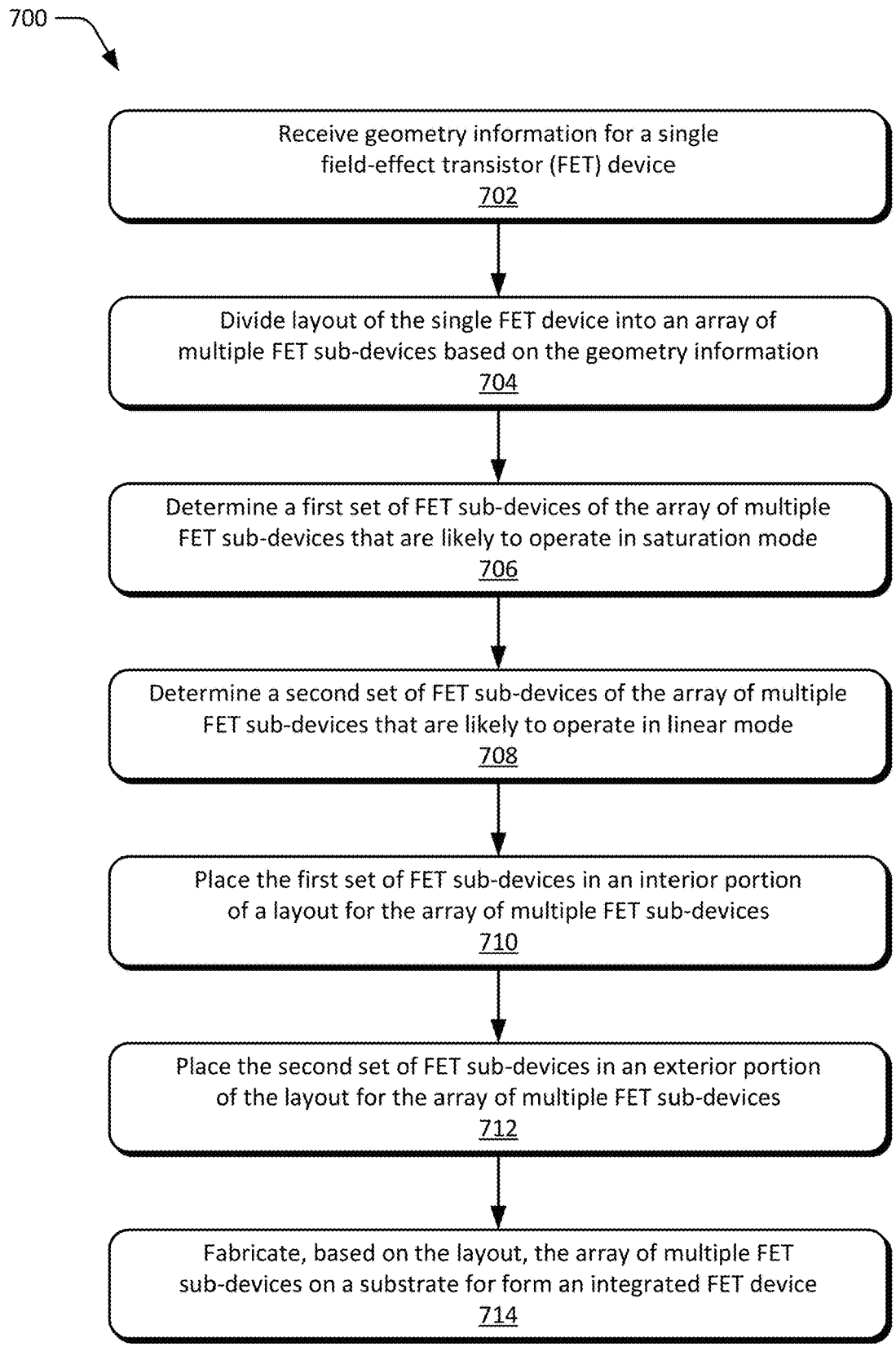
FIG. 7 depicts an example method for arranging a layout of an array of FET sub-devices to provide an integrated FET device.

FIG. 7 depicts an example method 700 for arranging layout of an array of FET sub-devices of an integrated FET device.

At 702, geometry information is received for a single FET device. The geometry information may include channel width and length information for the single FET device. In some cases, the single FET device is a large FET device sized for a particular analog circuit or sized to match another large FET device.

At 704, layout of the single FET is divided into an array of multiple FET sub-devices based on the geometry information. For example, a number and geometry of stacked FET sub-devices may be selected such that the FET sub-device stack provides an electrically equivalent function (W/L) is of a larger, single semiconductor device.

At 706, a determination is made as to a first set of FET sub-devices of the array that are likely to operate in saturation mode or saturation region. In some cases, a model or estimation may be made as to how many FET sub-devices of a stack will operate or are likely to operate in saturation mode. A FET sub-device stack may be implemented with any suitable ratio of saturation mode FET sub-devices to linear mode FET sub-devices, which ratio may vary over ranges of 60%-40% to 40%-60%.

At 708, a determination is made as to a second set of FET sub-devices of the array that are likely to operate in linear mode or linear region. In some cases, a model or estimation may be made as to how many FET sub-devices of a stack will operate or are likely to operate in linear mode. A FET sub-device stack may be implemented with any suitable ratio of linear mode FET sub-devices to saturation mode FET sub-devices, which ratio may vary over ranges of 70%-30% to 30%-70%.

At 710, the first set of FET sub-devices are placed in an interior portion of a layout for the array of multiple FET sub-devices. For example, the first set of FET sub-devices, or drain-side FET sub-devices may be placed in a center of the layout area for the array or in an area designated for mismatch sensitive devices (e.g., area 204).

At 712, the second set of FET sub-devices are placed in an exterior portion or edge of the layout for the array of multiple FET sub-devices. For example, the second set of FET sub-devices, or source-side FET sub-devices may be placed proximate a perimeter of the layout area of the array or around the area designated for mismatch sensitive devices. In some cases, second set of the FET sub-devices may be placed to surround the first set of the FET sub-devices on three sides or all sides.

Optionally at 714, the array of multiple FET sub-devices is fabricated, based on the layout, on a substrate to form an integrated FET device. For example, the integrated FET device may be fabricated or formed by implementing one or more of the operations described with reference to the method 500.

System-On-Chip

Figure 8:
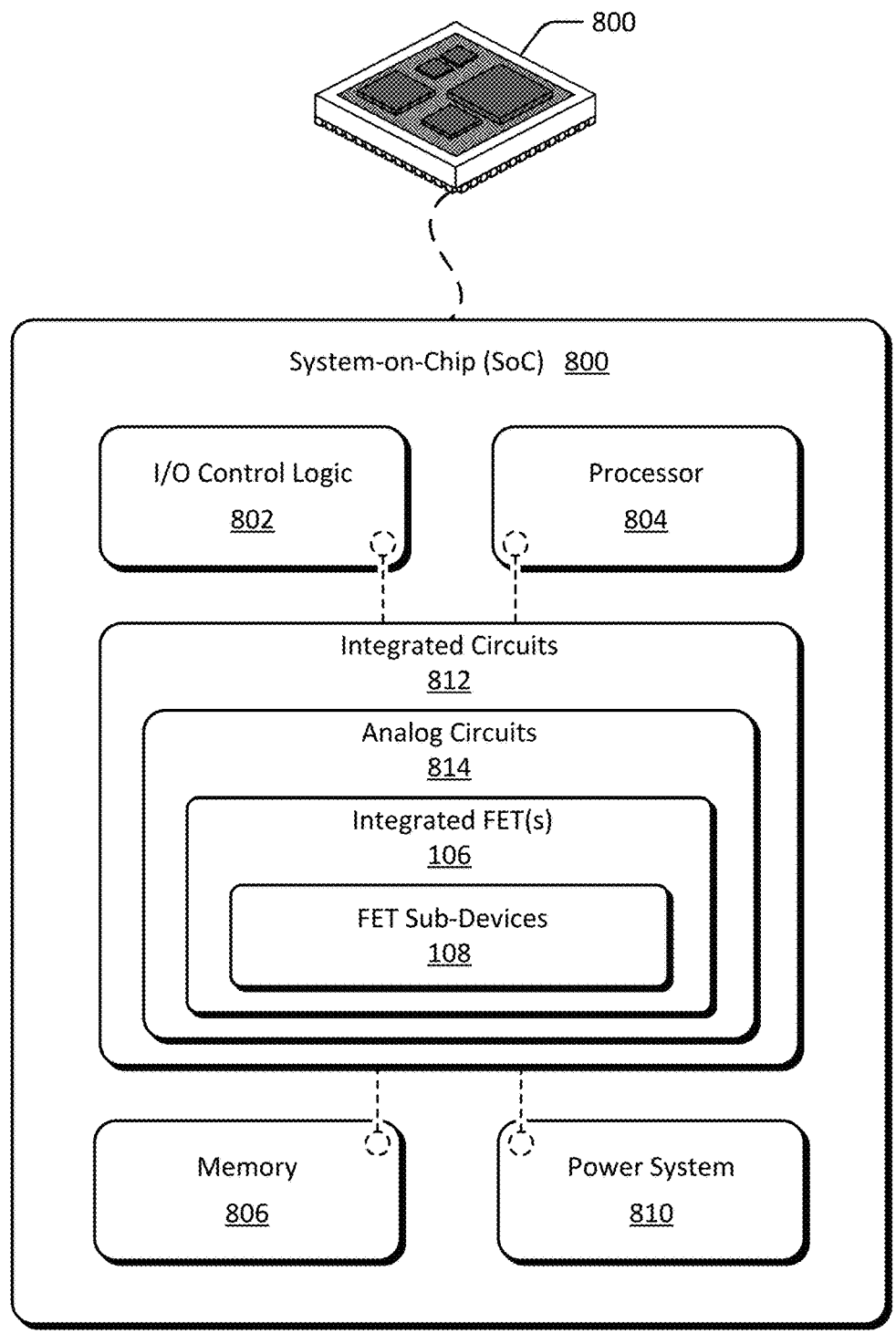
FIG. 8 illustrates an example System-on-Chip (SoC) environment in which aspects of the sub-device FET architecture may be implemented.

FIG. 8 illustrates an exemplary System-on-Chip (SoC) 800 in which aspects of the sub-device FET architecture for integrated circuits are implemented. The SoC 800 may be configured for or implemented in any suitable device, such as a smart-phone, netbook, tablet computer, access point, network-attached storage, smart appliance, set-top box, server, automotive computing system, or any other suitable type of device (e.g., others described herein). Although described with reference to a SoC, the entities of FIG. 8 may also be implemented as other types of integrated circuits or embedded systems, such as an ASIC, memory controller, storage controller, communication controller, ASSP, DSP, MCM, PSoC, SiP, or FPGA.

The SoC 800 may be integrated with electronic circuitry, a microprocessor, memory, input-output (I/O) control logic, communication interfaces, firmware, and/or software useful to provide the functionalities of a computing device. The SoC 800 may also include an integrated data bus or interconnect fabric (not shown) that couples the various components of the SoC for data communication between the components. The integrated data bus, interconnect fabric, or other components of the SoC 800 may be exposed or accessed through an external port, serial peripheral interface (SPI) port, or any other suitable data interface.

In this example, the SoC 800 includes various components such as input-output (I/O) control logic 802 and a processor 804, such as a microprocessor, processor core, application processor, DSP, or the like. The SoC 800 also includes memory 806 and a power system 810 to provide power management functionality for the SoC 800. The memory 806 may include any type and/or combination of RAM, SRAM, DRAM, non-volatile memory, ROM, one-time programmable (OTP) memory, Flash memory, and/or other suitable electronic data storage. In the context of this disclosure, the memory 806 stores data, instructions, or other information via non-transitory signals, and does not include carrier waves or transitory signals.

The SoC 800 may also include firmware, applications, programs, software, and/or operating system, which may be embodied as processor-executable instructions maintained on the memory 806 for execution by the processor 804 to implement functionalities of the SoC 800. The SoC 800 may also include other communication interfaces, such as a transceiver interface for controlling or communicating with components of a local on-chip (not shown) or off-chip communication transceiver. The transceiver interface may also implement a signal interface to communicate radio frequency (RF), intermediate frequency (IF), or baseband frequency signals off-chip to facilitate wired or wireless communication through transceivers, physical layer transceivers (PHYs), or media access controllers (MACs) coupled to the SoC 800.

The components of the SoC 800 are implemented by integrated circuits 812, which include analog circuits 814 and mixed-signal circuits (not shown). The analog circuits 814 of the SoC 800 include integrated FETs 106 and FET sub-devices, which may be embodied as described with reference to various aspects presented herein. Examples of these components and/or entities, or corresponding functionality, are described with reference to the respective components or entities of the environment 100 of FIG. 1 or respective configurations illustrated in FIG. 2, FIG. 3, and/or FIG. 4. The integrated FETs 106 and/or FET sub-devices 108 may be implemented independently or in combination with any suitable component or circuitry to implement aspects described herein. For example, integrated FETs 106 may be implemented as part of an analog circuit, a mixed-signal circuit, a current mirror, an amplifier, a filter, an analog-to-digital converter, or a digital-to-analog converter of the SoC 800.

Computing Device

Figure 9:
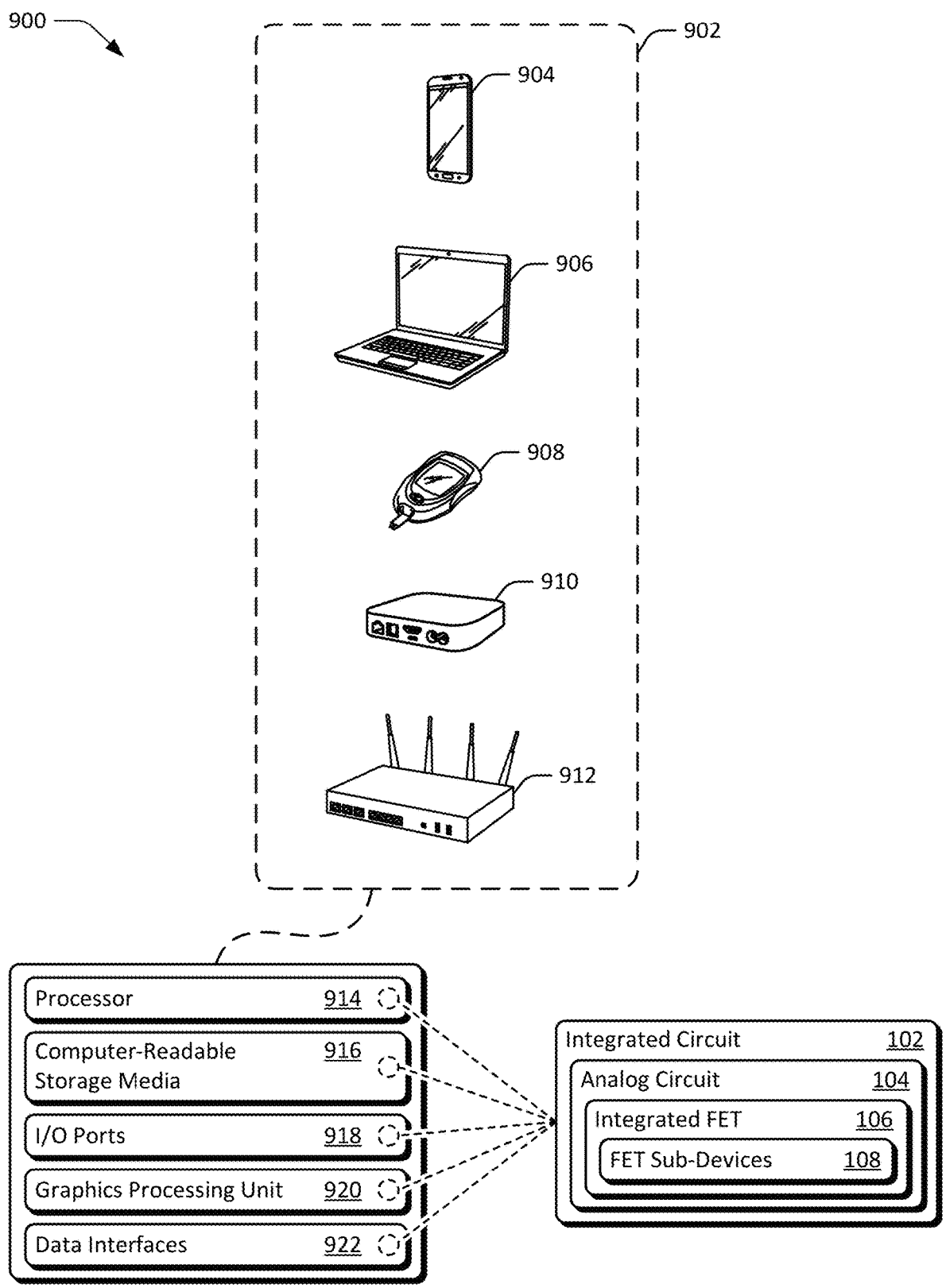
FIG. 9 illustrates an example computing device in which FET sub-devices are implemented in accordance with one or more aspects.

FIG. 9 illustrates an example computing device at 900 in which FET sub-devices are implemented in accordance with one or more aspects. Examples of a computing device 902 include a smart phone 904, laptop computer 906, medical device 908, set-top box 910, and wireless router 912. Further examples of the computing device 902 (not shown) include a tablet computer, a set-top-box, a data storage appliance, wearable smart-device, television, content-streaming device, high-definition multimedia interface (HDMI) media stick, wearable-computer, smart appliance, home automation controller, smart thermostat, Internet-of-Things (IoT) device, mobile-internet device (MID), a network-attached-storage (NAS) drive, gaming console, automotive entertainment device, automotive computing system, automotive control module (e.g., engine or power train control module), and so on. Generally, the computing device 902 may store, communicate, or process data for any suitable purpose, such as to enable functionalities of a particular type of device, provide a user interface, enable network access, or the like.

The computing device 902 includes a processor 914 and computer-readable storage media 916. The processor 914 may be implemented as any suitable type or number of processors, either single-core or multi-core, for executing instructions or commands of an operating system or other programs of the computing device 902. The computer-readable media 916 (CRM 916) can include any suitable type or combination of volatile memory or nonvolatile memory. For example, the volatile memory of the computing device 902 may include various types of RAM, DRAM, SRAM or the like. The non-volatile memory may include ROM, Flash memory (e.g., NOR Flash or NAND Flash), or magnetic storage disks. These memories, individually or in combination, may store data associated with applications and/or an operating system of the computing device 902.

The example computing device 902 may also include I/O ports 918, a graphics processing unit 920 (GPU 920), and data interfaces 922. Generally, the I/O ports 918 allow a computing device 902 to interact with other devices, peripherals, sensors, or users. For example, the I/O ports 918 may include a universal serial bus, audio inputs, audio outputs, or the like. The GPU 920 processes and renders graphics-related data for the computing device 902, such as user interface elements of an operating system, applications, or the like. The data interfaces 922 of the computing device 902 provide connectivity to one or more networks and other devices connected to those networks. The data interfaces 922 may include wired interfaces, such as Ethernet or fiber optic interfaces for communicating over a local area network (LAN), intranet, or the Internet. Alternately or additionally, the data interfaces 922 may include wireless interfaces that facilitate communication over wireless networks, such as wireless LANs, wide-area wireless networks (e.g., cellular networks), and/or wireless personal-area-networks (WPANs).

As illustrated in FIG. 9, various components of the computing device 902 may be implemented with integrated circuits 102 that include an analog circuit 104 or a mixed-signal circuit with integrated FET devices 106. In this example, any of the processor 914, CRM 916, I/O ports 918, GPU 920, and/or the data interfaces 922 may be implemented with integrated FETs 106 and FET sub-devices 108 in accordance with one or more aspects of sub-device FET architecture. Alternately or additionally, the integrated FETs 106 and FET sub-devices 108 may be implemented as part of any suitable circuit, such as an analog circuit, a mixed-signal circuit, a current mirror, an amplifier, a filter, an analog-to-digital converter, a digital-to-analog converter, or the like.

Although the subject matter has been described in language specific to structural features and/or methodological operations, it is to be understood that the subject matter defined in the appended claims is not necessarily limited to the specific examples, features, or operations described herein, including orders in which they are performed.

What is claimed is:

1. A method of forming an integrated field-effect transistor (FET) of FET sub-devices, the method comprising:
   forming a substrate for the integrated FET;
   forming, on the substrate, a first set of the FET sub-devices, a first FET sub-device of the first set of the FET sub-devices coupled to a drain terminal of the integrated FET; and
   forming, on the substrate, a second set of the FET sub-devices, a second FET sub-device of the second set of the FET sub-devices coupled to a source terminal of the integrated FET,
   wherein (i) the first set of the FET sub-devices is formed on an interior portion of substrate area on which the integrated FET is formed and (ii) the second set of the FET sub-devices is formed proximate a perimeter of the substrate area on which the integrated FET is formed.

2. The method as recited in claim 1, further comprising forming the second set of the FET sub-devices on a planar surface of the substrate area to surround the first set of the FET sub-devices on three sides.

3. The method as recited in claim 1, further comprising forming the second set of the FET sub-devices on a planar surface of the substrate area to surround the first set of the FET sub-devices on all sides.

4. The method as recited in claim 1, further comprising forming a gate terminal of the integrated FET coupled to respective gates of the first set of the FET sub-devices and respective gates of the second set of the FET sub-devices.

5. The method as recited in claim 1, further comprising forming the first set of the FET sub-devices or the second set of the FET sub-devices to couple a source of a third FET sub-device of the first set of the FET sub-devices to a drain of a fourth FET sub-device of the second set of the FET sub-devices.

6. The method as recited in claim 1, further comprising:
   forming the first set of the FET sub-devices of the integrated FET as first FinFET devices; or
   forming the second set of the FET sub-devices of the integrated FET as second FinFET devices.

7. The method as recited in claim 1, further comprising:
   forming the drain terminal of the integrated FET on the substrate;
   forming the source terminal of the integrated FET on the substrate; or
   forming a gate terminal of the integrated FET on the substrate.

8. The method as recited in claim 1, further comprising:
   forming the first set of the FET sub-devices with at least three FET sub-devices configured to operate in saturation mode; or
   forming the second set of the FET sub-devices with at least three FET sub-devices configured to operate in linear mode.

9. The method as recited in claim 1, wherein:
   the first set of the FET sub-devices is formed with respective gates that are less than 20 nanometers in length; or
   the second set of the FET sub-devices is formed with respective gates that are less than 20 nanometers in length.

10. An integrated circuit comprising:
   a substrate having a surface;
   an integrated field-effect transistor (FET) that includes an array of FET sub-devices formed on the surface of the substrate, the array of the FET sub-devices including:
      a first group of FET sub-devices having respective gates coupled to a gate terminal of the integrated FET and including a first FET sub-device having a drain coupled to a drain terminal of the integrated FET; and
      a second group of FET sub-devices having respective gates coupled to the gate terminal of the integrated FET and including a second FET sub-device having a source coupled to a source terminal of the integrated FET,
   wherein the array of FET sub-devices is formed on the surface of the substrate such that the second group of FET sub-devices are disposed around at least three sides of substrate area on which the first group of FET sub-devices are disposed.

11. The integrated circuit as recited in claim 10, wherein the array of FET sub-devices is formed on the surface of the substrate such that the second group of FET sub-devices are disposed to form a perimeter around the substrate area on which the first group of FET sub-devices are disposed.

12. The integrated circuit as recited in claim 10, wherein:
the first group of FET sub-devices of the integrated FET are configured to operate in a saturation mode or saturation region; and
the second group of FET sub-devices of the integrated FET are configured to operate in a linear mode or linear region.

13. The integrated circuit as recited in claim 10, wherein:
the respective gates of the first group of FET sub-devices have a gate length that is less than 20 nanometers; or
the respective gates of the second group of FET sub-devices have a gate length that is less than 20 nanometers.

14. The integrated circuit as recited in claim 10, wherein:
a source of a third FET sub-device of the first group of the FET sub-devices is coupled to a drain of a fourth FET sub-device of the second group of the FET sub-devices.

15. The integrated circuit as recited in claim 10, wherein geometry of the FET sub-devices of the first group is substantially similar to geometry of the FET sub-devices of the second group.

16. The integrated circuit as recited in claim 10, wherein:
functionality of the integrated FET is provided at least in part by the second group of FET sub-devices; and
the second group of the FET sub-devices are disposed adjacent to the first group of FET sub-devices without having non-functional devices disposed on the substrate between the first group of FET sub-devices and the second group of FET sub-devices.

17. The integrated circuit as recited in claim 10, wherein:
the first group of FET sub-devices is implemented on the surface of the substrate as a first group of FinFET devices of the integrated FET; or
the second group of FET sub-devices is implemented on the surface of the substrate as a second group of FinFET devices of the integrated FET.

18. The integrated circuit as recited in claim 10, wherein the integrated circuit is embodied in whole or part as an analog circuit, a mixed-signal circuit, a current mirror, an amplifier, a filter, an analog-to-digital converter, or a digital-to-analog converter.

19. A method comprising:
providing, via a power rail, a current to a source terminal of an integrated field-effect transistor (FET) formed by multiple FET sub-devices disposed on an area of a substrate;
forming a first group of the multiple FET sub-devices on an interior portion of the area of the substrate on which the integrated FET is formed and forming a second group of the multiple FET sub-devices formed proximate a perimeter of the area of the substrate on which the integrated FET is formed;
applying voltage to a gate terminal of the integrated FET to operate the first group of the multiple FET sub-devices in saturation mode and the second group of the FET sub-devices in linear mode; and
providing, based on the voltage applied to the gate terminal, at least a portion of the current to a drain terminal of the integrated FET via the first group and the second group of the multiple FET sub-devices of the integrated FET.

20. The method as recited in claim 19, wherein:
respective gates of the first and second groups of the multiple FET sub-devices are coupled to the gate terminal of the integrated FET; and
applying the voltage comprises applying, via the gate terminal, the voltage to the respective gates of the first and second groups of the multiple FET sub-devices.

* * * * *